(12) United States Patent
Ogura et al.

(10) Patent No.: US 10,839,911 B2
(45) Date of Patent: Nov. 17, 2020

(54) SEMICONDUCTOR MEMORY DEVICE AND DATA WRITING METHOD

(71) Applicant: TOSHIBA MEMORY CORPORATION, Minato-ku, Tokyo (JP)

(72) Inventors: Tatsuo Ogura, Yokkaichi Mie (JP); Hideto Horii, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/284,928

(22) Filed: Feb. 25, 2019

(65) Prior Publication Data
US 2020/0090755 A1    Mar. 19, 2020

(30) Foreign Application Priority Data
Sep. 19, 2018  (JP) .................................. 2018-175253

(51) Int. Cl.
| | |
|---|---|
| *G11C 16/34* | (2006.01) |
| *G11C 16/10* | (2006.01) |
| *G11C 16/08* | (2006.01) |
| *H01L 27/11582* | (2017.01) |
| *G11C 8/14* | (2006.01) |
| *H01L 27/1157* | (2017.01) |
| *G11C 16/24* | (2006.01) |

(52) U.S. Cl.
CPC ................ *G11C 16/10* (2013.01); *G11C 8/14* (2013.01); *G11C 16/08* (2013.01); *G11C 16/24* (2013.01); *H01L 27/1157* (2013.01); *H01L 27/11582* (2013.01)

(58) Field of Classification Search
CPC .................................................. G11C 16/3454
USPC ................................................... 365/185.22
See application file for complete search history.

(56) References Cited

U.S. PATENT DOCUMENTS

| | | | |
|---|---|---|---|
| 6,894,931 B2 | 5/2005 | Yaegashi et al. | |
| 9,070,445 B2 | 6/2015 | Yasuda et al. | |
| 9,640,265 B1 | 5/2017 | Honma | |
| 9,640,266 B1 | 5/2017 | Seo | |
| 9,754,957 B2 | 9/2017 | Lee et al. | |
| 9,806,091 B2 | 10/2017 | Miyagawa et al. | |
| 2009/0290429 A1 | 11/2009 | Dong et al. | |

(Continued)

FOREIGN PATENT DOCUMENTS

| | | |
|---|---|---|
| TW | 201001436 A | 1/2010 |
| TW | 201732836 A | 9/2017 |

*Primary Examiner* — Jason Lappas
(74) *Attorney, Agent, or Firm* — Foley & Lardner LLP

(57) ABSTRACT

A semiconductor memory device includes a plurality of memory cells, a plurality of word lines connected to the plurality of memory cells, respectively, and a row control circuit. The row control circuit is configured to apply a program voltage to a first word line among the word lines while stepping up a value of the program voltage; apply a first pass voltage to a second word line among the word lines different from the first word line when applying the program voltage having a voltage value equal to or greater than a predetermined voltage value to the first word line; and apply a second pass voltage having a voltage value higher than the first pass voltage to the second word line when applying the program voltage having a voltage value less than the predetermined voltage value to the first word line.

14 Claims, 12 Drawing Sheets

(56) References Cited

U.S. PATENT DOCUMENTS

2009/0323432 A1* 12/2009 Futatsuyama ...... G11C 16/3454
365/185.22
2010/0329026 A1   12/2010 Nakamura et al.
2017/0148517 A1    5/2017 Harari

* cited by examiner

SEMICONDUCTOR MEMORY DEVICE AND DATA WRITING METHOD

CROSS-REFERENCE TO RELATED APPLICATIONS

This application claims the benefit of and priority to Japanese Patent Application No. 2018-175253, filed Sep. 19, 2018, the entire contents of which are incorporated herein by reference.

FIELD

Embodiments described herein relate generally to a semiconductor memory device and a data writing method.

BACKGROUND

A three-dimensional stacked flash memory (a three dimensional memory) may be used in a memory device.

The three-dimensional memory has a structure in which flash memory elements are stacked in a vertical direction from a silicon plane or plate. It may be desirable to increase a memory capacity per unit area and improve a writing speed.

When data is written in the three-dimensional memory, a write voltage is gradually increased by a so-called step-up writing method for each word line and multi-value data (charge) is written in a charge trap film (a charge retention layer) of each cell.

However, when data is written in a first word line and then written in a second word line adjacent to the first word line, neighboring word line interference (NWI) may occur in which a threshold voltage (Vth) of each cell of the first word line to which writing has already completed is increased.

DETAILED DESCRIPTION

An embodiment provides for a semiconductor memory device and a data writing method capable of reducing or preventing neighboring word line interference when data is written to a charge trap film using a step-up writing method. In general, according to one embodiment, a semiconductor memory device includes a plurality of memory cells, a plurality of word lines connected to the plurality of memory cells, respectively, and a row control circuit. The row control circuit is configured to apply a program voltage to a first word line among the word lines while stepping up a value of the program voltage; apply a first pass voltage to a second word line among the word lines different from the first word line when applying the program voltage having a voltage value equal to or greater than a predetermined voltage value to the first word line; and apply a second pass voltage having a voltage value higher than the first pass voltage to the second word line when applying the program voltage having a voltage value less than the predetermined voltage value to the first word line.

Hereinafter, a semiconductor memory device according to an embodiment will be described in detail with reference to the drawings. The semiconductor memory device according to an embodiment is a semiconductor memory device including a memory cell array.

First Embodiment

Block Configuration of Semiconductor Memory Device

Figure 1:
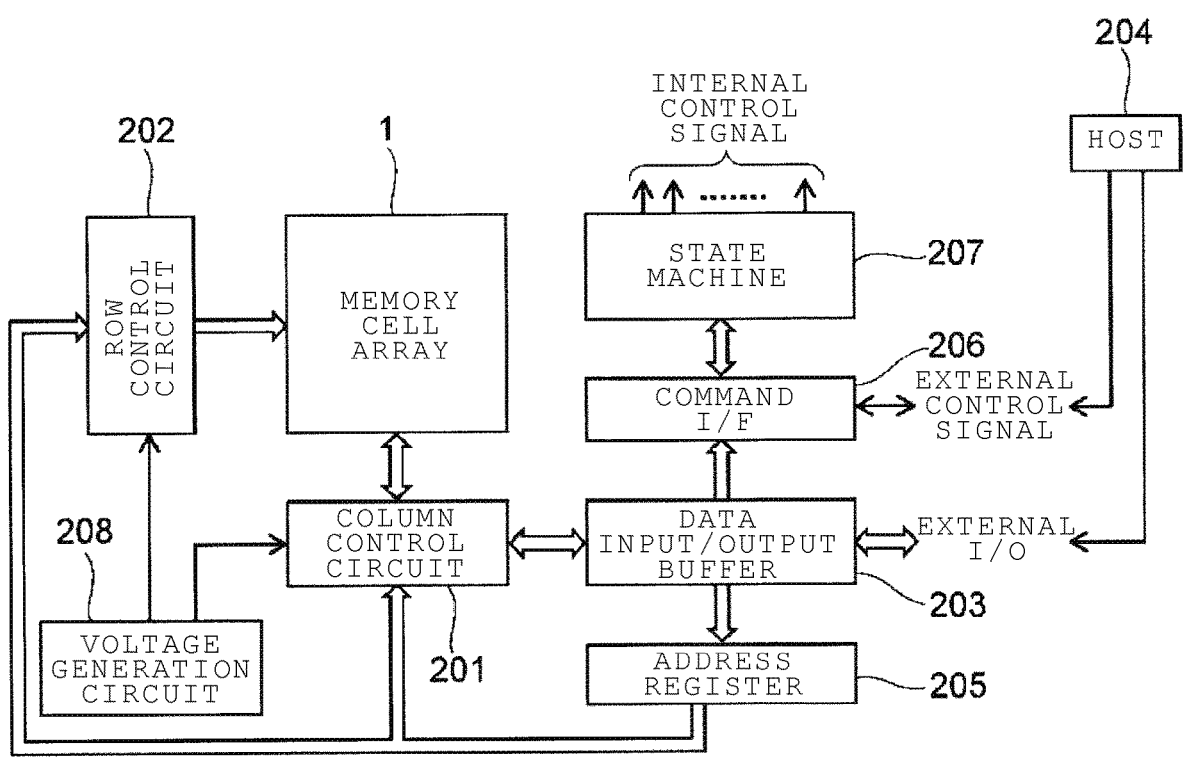
FIG. 1 is a block diagram of a semiconductor memory device according to a first embodiment.

FIG. 1 is a block diagram of an example semiconductor memory device according to the first embodiment. As illustrated in FIG. 1, the semiconductor memory device includes a memory cell array 1. In the memory cell array 1, for example, a bit line BL, a word line WL, a source line SL, a drain side select transistor STD, a memory cell MC, and a source side select transistor STS are provided.

A column control circuit 201 and a row control circuit 202 are provided around the memory cell array 1. The column control circuit 201 controls potentials of the bit line BL and the source line SL to erase data from the memory cell MC, write data to the memory cell MC, and read data from the memory cell MC.

The row control circuit 202 selects the word line WL and supplies a potential for erasing data from the memory cell MC, writing data to the memory cell MC, and reading (verifying) data from the memory cell MC to gate electrodes of the drain side select transistor STD, the memory cell MC, and the source side select transistor STS.

A data input/output buffer 203 receives external I/O data from an external host 204. The data input/output buffer 203 receives writing data, receives command data, receives address data, and outputs read data to the outside (externally).

The data input/output buffer 203 transmits the received writing data to the column control circuit 201. The column control circuit 201 transmits the data read from the memory cell array 1 to the data input/output buffer 203. The data input/output buffer 203 outputs the received read data to the outside.

The data input/output buffer 203 transmits the received address data to an address register 205. The address register 205 transmits the received address data to the column control circuit 201 and the row control circuit 202.

A command interface (command I/F) 206 receives an external control signal from the host 204. The command interface (command I/F) 206 determines whether the data received by the data input/output buffer 203 is the writing data, the command data, or the address data on the basis of the received external control signal. When the data received by the data input/output buffer 203 is the command data, the command interface 206 transmits the command data to a state machine 207 as a command signal.

The state machine 207 controls the operation of the semiconductor memory device. The state machine 207 receives the command data from the host 204 through the command interface 206 and outputs an internal control signal. Therefore, for example, writing, reading, erasing, data input/output, and the like are managed. A voltage generation circuit 208 generates an internal voltage for a writing operation, a reading operation, and an erasing operation on the basis of the internal control signal. The state machine 207 manages status information. The status information may also be transmitted to the host 204. The host 204 may determine an operation state or an operation result of the semiconductor memory device by receiving the status information.

Circuit Configuration of Semiconductor Memory Device

Figure 2:
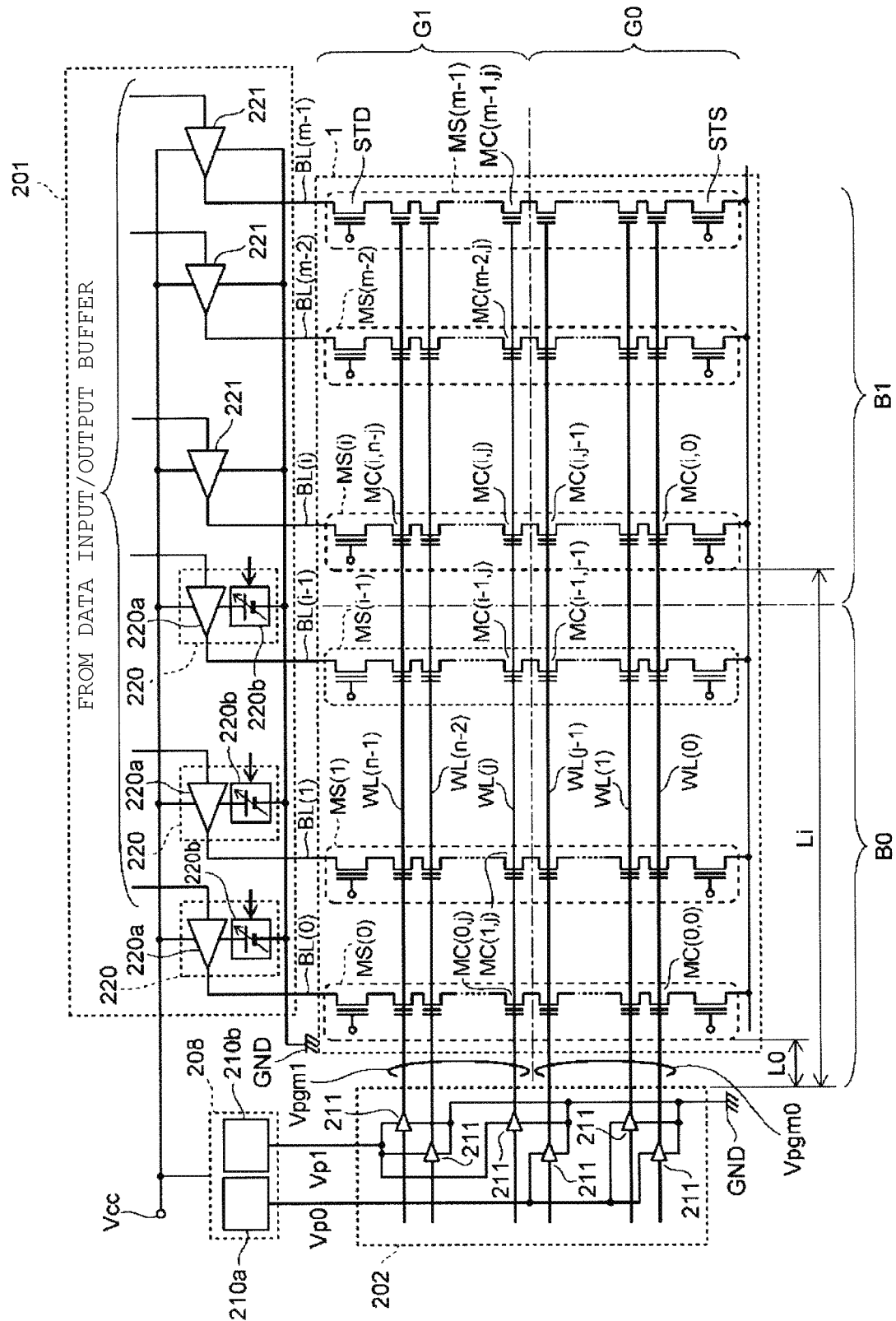
FIG. 2 is a diagram illustrating a circuit configuration of a main part of the semiconductor memory device.

FIG. 2 is a diagram illustrating an example circuit configuration of a main part of the semiconductor memory device according to the embodiment. FIG. 2 is a diagram illustrating an equivalent circuit of a part of the memory cell array 1, a part of the column control circuit 201, a part of the row control circuit 202, and the voltage generation circuit 208.

As illustrated in FIG. 2, the memory cell array 1 includes a plurality of memory strings MS. The memory string MS includes memory cells MC connected in series. The source side select transistor STS is connected between the memory cell MC at one end connected in series and the source line SL. The drain side select transistor STD is connected between the memory cell MC at the other end connected in series and the bit line BL(i).

The source side select transistor STS, each memory cell MC, and the drain side select transistor STD are electrically connected in series by a channel formed in a semiconductor body, as will be described in detail later. The bit line BL(i) is electrically connected to the channel formed in the semiconductor body.

In this example, m-sets of bit lines BL(i) are provided. "i" is an integer from 0 to m−1. Each bit line BL(i) is connected to an output of the column control circuit 201.

In the memory cell array 1, for example, one memory string MS(i+1) is connected to a word line WL(j) to which an adjacent memory string MS (i) is connected. That is, a (j+1)-th word line WL(j) is shared by another memory strings MS(i). In this example, n-sets of word lines WL(j) are provided. "j" is an integer from 0 to n−1.

The word line WL(j) is connected to an output of the row control circuit 202. The row control circuit 202 applies a voltage to each word line WL(j).

The column control circuit 201 and the row control circuit 202 are disposed in a peripheral portion of the memory cell array 1. In this example, the row control circuit 202 is provided at a position adjacent to a first memory string MS(0). A second memory string MS (1) is provided adjacent to the first memory string MS(0). That is, the first memory string MS(0) is provided between the second memory string MS(1) and the row control circuit 202.

An m-th memory string MS (m−1) is provided at a position farthest from the row control circuit 202. An (m−1)-th memory string MS (m−2) is disposed adjacent to the m-th memory string MS(m−1). Although not illustrated, an (m−2)-th memory string MS (m−3) is disposed adjacent to the (m−1)-th memory string MS (m−2), and the (m−1)-th memory string MS(m−2) is provided between the m-th memory string MS (m−1) and the (m−2)-th memory string MS(m−3).

In other words, a distance L0 from the row control circuit 202 to the first memory string MS(0) is shorter than a distance L(i) from the row control circuit 202 to the memory string MS(i). Here, "i" is an integer larger than 1.

A memory cell MC(i, j) of each memory string MS(i) is connected to the word line WL(j) by a gate electrode. That is, memory cells MC(0, j) to MC(m−1, j) are electrically connected to the same word line WL(j). A distance between the row control circuit 202 and the memory string MS(i) is substantially the same as a length of the word line WL(j) provided between the row control circuit 202 and the memory cell MC(i, j). For example, a length of the word line WL(0) from the row control circuit 202 to the memory cell MC(0, 0) is shorter than a length of the word line WL(0) from the row control circuit 202 to the memory cell MC(i, 0).

Therefore, when the width and thickness of the word line WL(0) are constant, a resistance value of the word line WL(0) from the row control circuit 202 to the memory cell MC(0, 0) is smaller than a resistance value of the word line WL(0) from the row control circuit 202 to the memory cell MC(i, 0).

In the semiconductor memory device of the first embodiment, the memory cell array 1 includes groups B0 and B1 of two memory strings MS. The two groups B0 and B1 are set by a separation distance of the memory string MS from the row control circuit 202. The group B0 includes memory strings MS(0) to MS (i−1) disposed at positions closer to the row control circuit 202 than the group B1. A length of the word line connected to the memory cells MC(0, j) to MC(i−1, j) in the group B0 is set to be shorter than a length of the word line connected to the memory cells MC(i, j) to MC(m−1, j) in the group B1.

Each of the groups B0 and B1 includes adjacent memory strings MS (i−1) and MS(i). A boundary between the groups B0 and B1 may be set as appropriate. For example, when the memory cell array 1 includes m-sets of memory strings, first to m/2-th memory strings of which distances from the row control circuit 202 is close may be set as the group B0, and m/2+1-th to m-th memory strings may be set as the group B1.

The column control circuit 201 of the semiconductor memory device of the first embodiment includes column drivers 220 and 221 connected to the bit lines BL(0) to BL(m−1). An output of the column driver 220 is connected to the bit lines BL(0) to BL(i−1) in the group B0. An output of the column driver 221 is connected to the bit lines BL(i) to BL(m−1) in the group B1.

The column driver 220 includes a driver 220a and a compensation voltage generation circuit 220b. The driver 220a and the compensation voltage generation circuit 220b are connected in series. In this example, the series circuit of the driver 220a and the compensation voltage generation circuit 220b is connected between a power supply voltage Vcc and a ground potential GND. The ground potential GND is, for example, the lowest potential of the semiconductor memory device. The power supply voltage Vcc and the ground potential GND are supplied from an external power supply device or the like (not illustrated).

The compensation voltage generation circuit 220b outputs a compensation voltage Vcmp that is set in advance. The compensation voltage Vcmp is set in a range from the ground potential GND to the power supply voltage Vcc. For example, the compensation voltage Vcmp is set to a range from about 0.1% to about several % (e.g., about 1%, about 3%, or about 5%) of a program voltage Vpgm applied to a gate electrode of the memory cell MC(i, j). For example, when the program voltage Vpgm is 20 V, Vcmp is 0.2 V or so.

The compensation voltage Vcmp output from the compensation voltage generation circuit 220b may be set as appropriate by an external signal or the like. As will be described later, the compensation voltage Vcmp can be set to an appropriate value according to the resistance value by the length of the word line WL(j).

Furthermore, in the semiconductor memory device according to the first embodiment, the compensation voltage Vcmp can also be set according to the memory cell MC in the same memory string MS. For example, the compensation voltage Vcmp of a case where writing to the memory cell MC(i, j) of the word line WL(j) is performed can be set higher than the compensation voltage Vcmp of a case where writing to the memory cell MC(i, j−1) of the word line WL(j−1) lower than the word line WL(j) by one layer is performed. Similarly, the compensation voltage Vcmp for writing to the memory cell MC of the word line WL of an upper layer can be set higher. That is, the compensation voltage Vcmp related to one bit line BL is able to change a value to be set for each word line WL to which the data is written.

The column driver 220 drives the bit lines BL(0) to BL(i−1) according to input data. For example, a high level of a driving voltage of the bit lines BL(0) to BL(i−1) is the power supply voltage Vcc and a low level of the driving voltage of the bit lines BL(0) to BL(i−1) is the compensation voltage Vcmp.

The column driver 221 may be the same as the driver 220a. The column driver 221 drives the bit lines BL(i) to BL(m−1). For example, a high level of a driving voltage of the bit lines BL(i) to BL(m−1) is the power supply voltage Vcc and a low level of the driving voltage of the bit lines BL(i) to BL(m−1) is the ground potential GND.

When data is written, the column drivers 220 and 221 set a selected bit line to the low level (writing selection). The column drivers 220 and 221 set a non-selected bit line to the high level (writing inhibition).

As will be described later, the memory cell MC(i, j) is stacked together with the word line WL(j) and is formed.

The word line WL(j) is connected to the memory cell MC(i, j) of another memory string MS(i) in the same layer. The memory cell array 1 includes groups G0 and G1. The two groups G0 and G1 are a lower layer group G0 and an upper layer group G1.

The row control circuit 202 includes a row driver 211 connected to each word line WL(j). Power is supplied from the voltage generation circuit 208 to the row driver 211. The voltage generation circuit 208 includes a first pump circuit 210a and a second pump circuit 210b. For example, the first pump circuit 210a and the second pump circuit 210b receive electric power from the power supply voltage Vcc and output a predetermined voltage.

A pump voltage Vp0 is supplied from the first pump circuit 210a to the row driver 211 of the lower layer group G0. A pump voltage Vp1 is supplied from the second pump circuit 210b to the row driver 211 of the upper layer group G1.

At the time of data writing, the program voltage Vpgm is applied to one selected word line WL. A pass voltage Vpass is applied to remaining unselected word lines WL. The pass voltage Vpass is a voltage that causes the memory cell MC to conduct regardless of a threshold voltage thereof. The voltage Vpass is, for example, a voltage between the program voltage Vpgm and the ground potential GND.

In the embodiment, in an example implementation a value of the program voltage Vpgm is changed at the word lines WL(0) to WL(j−1) connected to the memory cell MC in the lower layer group G0 and the word lines WL(j) to WL(n−1) connected to the memory cell MC in the upper layer group G1. A voltage Vpgm0 is applied as the program voltage Vpgm to the memory cell MC in the lower layer group G0. A voltage Vpgm1 is applied as the program voltage Vpgm to the memory cell MC in the lower layer group G0. The voltage Vpgm0 is, for example, lower than the voltage Vpgm1. The voltage Vpgm0 is obtained, for example, on the basis of the voltage Vp0 output from the first pump circuit 210a. The voltage Vpgm1 is obtained, for example, on the basis of the voltage Vp1 output from the second pump circuit 210b.

In addition, at the time of data writing, it is also possible to use step-up writing. For example, the step-up writing is one of writing methods designed so that writing can be performed even for a cell in which the threshold voltage hardly shifts. In the step-up writing, each time a cycle of "writing to verify reading" is repeated, a maximum program voltage is stepped up by a predetermined step voltage ΔVpgm.

In the embodiment, the program voltage Vpgm0 applied to the word lines WL(0) to WL(j−1) is increased every cycle, for example, "Vpgm0+ΔV" to "Vpgm0+2·ΔV" to "Vpgm0+3·ΔV". Similarly, the program voltage Vpgm1 applied to the word lines WL(j) to WL(n−1) is increased every cycle, for example, "Vpgm1+ΔV" to "Vpgm1+2·ΔV" to "Vpgm1+3·ΔV". In the embodiment, it is also possible to use the step-up writing.

Furthermore, in the semiconductor memory device according to the first embodiment, for example, the group B0 of the memory strings MS disposed at the position close to the row control circuit 202 and the group B1 of the memory strings MS disposed at a position far from the row control circuit 202 supply different voltages to the selected bit line BL.

In the embodiment, at the time of data writing, for example, the voltage of the bit line BL is controlled as follows.
<Group B0>
Writing selection: Vcmp
Writing inhibition: Vcc
<Group B1>
Writing selection: GND
Writing inhibition: Vcc As described herein, a voltage applied between the gate electrode (word line) of the memory cell MC in the group B0 and the semiconductor body is lower than a voltage applied between the gate electrode of the memory cell in the group B1 and the semiconductor body by the compensation voltage Vcmp.

Generally, an amount of electrons injected into the memory cell MC tends to increase with a length of a time during which an effective program voltage Vpgm is applied (an effective writing pulse width).

Normally, the effective writing pulse width varies depending on a time constant RC of the word line WL. For example, the effective writing pulse width of the group B0 close to the row control circuit 202 is wider than the effective writing pulse width of the group B1 far from the row control circuit 202. Therefore, the amount of the electrons injected into the memory cell MC in the group B0 is larger than the amount of the electrons injected into the memory cell MC in the group B1.

In response to such circumstances, the semiconductor memory device of the first embodiment supplies, for example, the compensation voltage Vcmp higher than the ground potential GND to the bit line BL in the group B0 and supplies, for example, the ground potential GND to the bit line BL in the group B0. Therefore, in the embodiment, the voltage of the channel of the memory cell MC selected for writing is as follows.
<Group B0>
Writing selection: substantially Vcmp
Writing inhibition: Vboost
<Group B1>
Writing selection: substantially GND
Writing inhibition: Vboost In the case of the writing inhibition, the voltage of the bit line BL is set to, for example, the power supply voltage Vcc. In this case, the drain side select transistor STD is cut off. Therefore, the channel of the memory cell MC is electrically floated. The electrically floated channel is coupled with the word line WL to which the pass voltage Vpass or the program voltage Vpgm is applied, and a voltage of the channel is increased to the boost voltage Vboost. The boost voltage Vboost is, for example, higher than the power supply voltage Vcc.

In the case of the writing selection, the voltage of the bit line BL is set to the compensation voltage Vcmp or the ground potential GND. In this case, the drain side select transistor STD is turned on. Therefore, a voltage of about the compensation voltage Vcmp or a voltage of about the ground potential GND is transmitted to the channel.

The amount of the electrons injected into the memory cell MC tends to increase with a size of a potential difference between the channel and the gate electrode (word line). From this tendency, the amount of the electrons injected into the memory cell MC in the group B0, in which the voltage of the channel is about the compensation voltage Vcmp, is reduced.

As described above, according to the embodiment capable of reducing the amount of the electrons injected into the memory cell MC in the group B0, the amount of the electrons injected into the memory cell MC in the group B0 can be made close to the amount of the electrons injected into the memory cell MC in the group B1. Therefore, it is possible to reduce a variation between the threshold voltage of the memory cell MC in the group B0 and the threshold voltage of the memory cell MC in the group B1, and to suppress an increase of a variation of the threshold voltage of the memory cell MC after the data writing.

In addition, in the semiconductor memory device of the first embodiment, the program voltage Vpgm0 applied to the gate electrode in the group G0 of the memory cell formed in the lower layer is set to be lower than the program voltage Vpgm1 applied to the gate electrode in the upper layer group G1. Therefore, the threshold voltage of the memory cell in the lower layer group G0 is prevented from largely shifting to the positive side, so that it can be reduced to nearly the degree of shift of the threshold voltage of the memory cell in the upper layer group G1.

In the above description, the memory cell array 1 is divided into the groups B0 and B1, and the voltage of the bit line selected for writing is set to the compensation voltage Vcmp or the ground potential GND. The boundary between the groups B0 and B1 is selected according to design specifications. The number of divisions is not limited to two of the groups B0 and B1, and the memory cell array 1 may be divided into three or more. In a case where the memory cell array 1 is divided into three or more, the value of the compensation voltage Vcmp may be increased, for example, as a group is close to the row control circuit 202.

In addition, it is also possible to set the value of the compensation voltage Vcmp for each word line WL in accordance with a difference between the effective writing pulse width applied to the memory cell MC in the group B0 and the effective writing pulse width applied to the memory cell MC in the group B1. For example, when the difference is large, the value of the compensation voltage Vcmp may be increased, and when the difference is small, the value of the compensation voltage Vcmp may be decreased.

Configuration of Memory Cell Array of Semiconductor Memory Device

Figure 3:
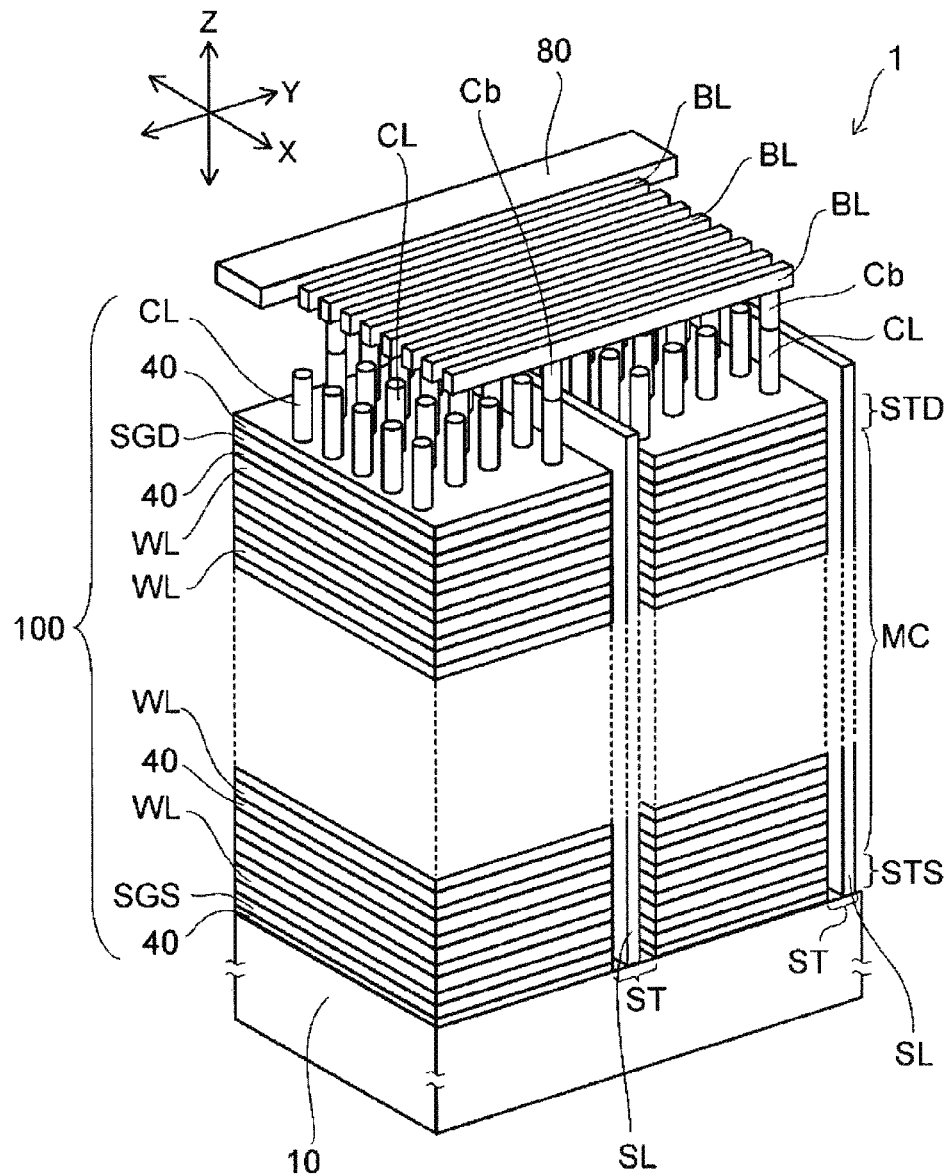
FIG. 3 is a perspective view of a memory cell array of the semiconductor memory device.

FIG. 3 is a perspective view of the memory cell array 1 of the semiconductor memory device of the first embodiment. As illustrated in FIG. 3, the memory cell array 1 has a stacked body 100, a plurality of columnar portions CL, and a plurality of slits ST. The stacked body 100 includes a drain side select gate SGD, a plurality of word lines WL, and a source side select gate SGS.

The source side select gate SGS is provided on a substrate 10. The substrate 10 is, for example, a semiconductor substrate. The semiconductor substrate includes, for example, silicon. The plurality of word lines WL are provided on the source side select gate SGS. The drain side select gate SGD is provided on the plurality of word lines WL. The drain side select gate SGD, the plurality of word lines WL, and the source side select gate SGS are electrode layers. The number of the electrode layers that are stacked is set according to design specifications.

The electrode layers (SGD, WL, and SGS) are separately stacked. An insulator 40 is disposed between the electrode layers (SGD, WL, and SGS). The insulator 40 may be an insulator such as a silicon oxide film or an air gap. The stacked body 100 alternately includes the insulator 40 and the electrode layers (SGD, WL, and SGS).

At least one of the drain side select gates SGD is used as a gate electrode of the drain side select transistor STD. The source side select transistor STS uses at least one of the source side select gates SGS as a gate electrode. A plurality of memory cells MC are connected in series between the drain side select transistor STD and the source side select transistor STS. The memory cell MC uses one of the word lines WL as a gate electrode.

The slit ST is provided in the stacked body 100. The slit ST extends inside the stacked body 100 in a stacking direction (Z direction) and an X direction. The slit ST separates the stacked body 100 into a plurality of stacked bodies in a Y direction. A region separated by the slit ST is referred to as a "block".

In the slit ST, a source line SL is disposed. The source line SL is a conductor. The source line SL is insulated from the stacked body 100, and for example, extends in a plate shape in the Z direction and the X direction. An upper layer wiring 80 is disposed above the source line SL. The upper layer wiring 80 extends in the Y direction. The upper layer wiring 80 is electrically connected to a plurality of source lines SL arranged along the Y direction.

The columnar portion CL is provided in the stacked body 100 separated by the slit ST. The columnar portion CL extends in the stacking direction (Z direction). The columnar portion CL is formed in, for example, a columnar shape or an elliptical columnar shape. The columnar portion CL is disposed in the memory cell array 1, for example, in a staggered lattice pattern or a tetragonal lattice pattern. The drain side select transistor STD, the plurality of memory cells MC, and the source side select transistor STS are disposed in the columnar portion CL.

A plurality of bit lines BL are disposed above an upper end portion of the columnar portion CL. The plurality of bit lines BL extend in the Y direction. The upper end portion of the columnar portion CL is electrically connected to one of the bit lines BL through a contact portion Cb. One bit line BL is electrically connected to the columnar portion CL selected one by one from each block.

Configuration of Columnar Portion

Figure 4:
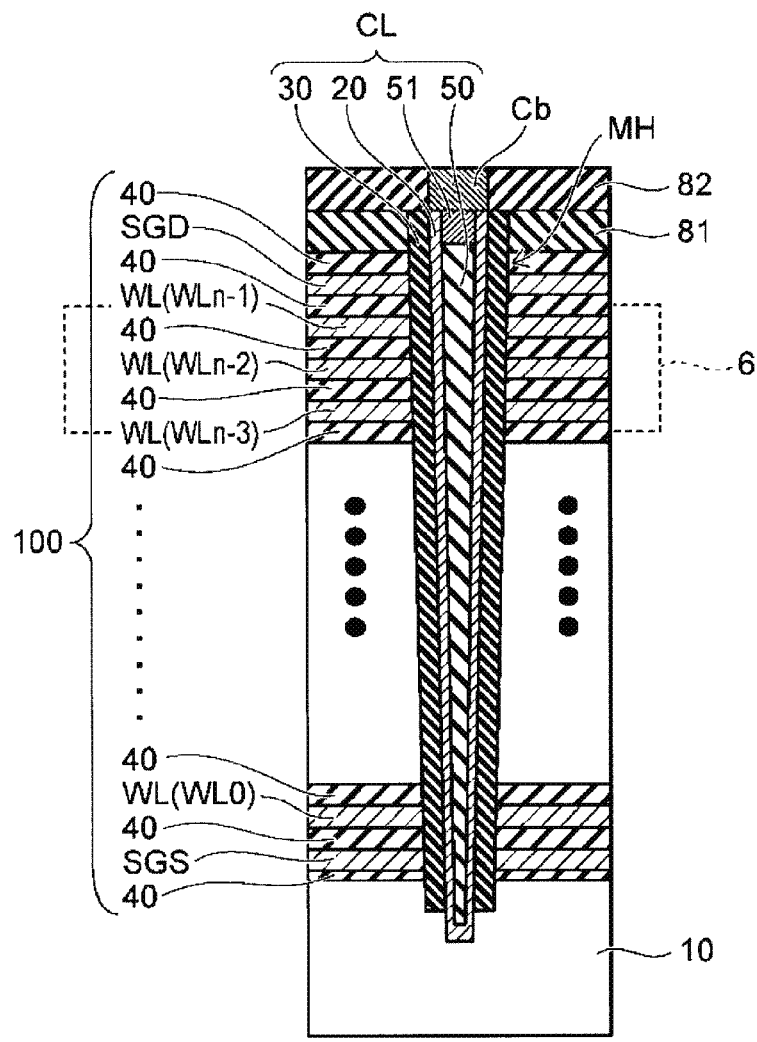
FIG. 4 is a cross-sectional view of a columnar portion of the semiconductor memory device.
Figure 5:
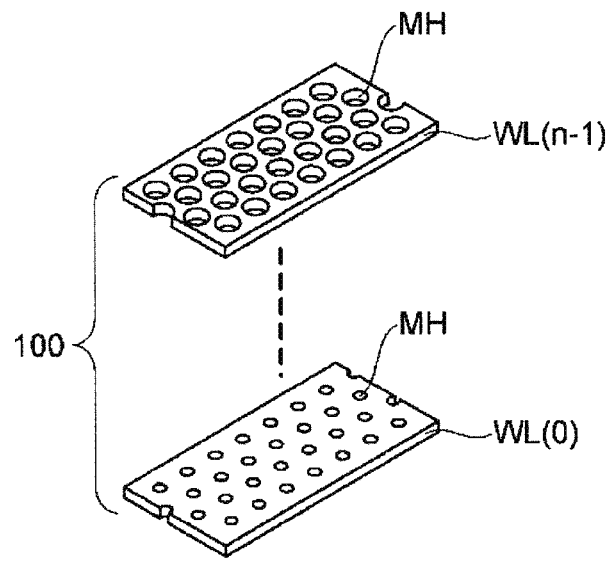
FIG. 5 is a perspective view of an uppermost word line and a lowermost word line.
Figure 6:
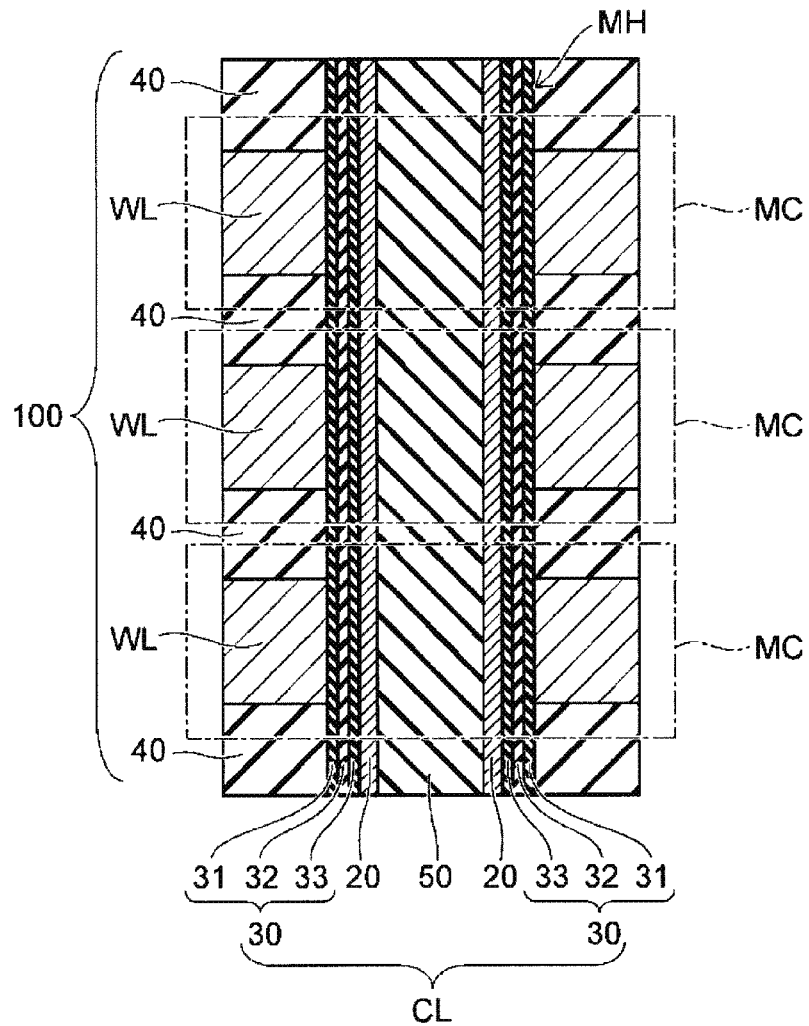
FIG. 6 is an enlarged cross-sectional view of an inside of a section delineated by a broken line in FIG. 4.

FIG. 4 is a cross-sectional view of the columnar portion CL of the semiconductor memory device. FIG. 5 is a perspective view of an uppermost word line WL(n−1) and a lowermost word line WL(0). FIG. 6 is an enlarged cross-sectional view of an inside of a portion delineated by a broken line 6 in FIG. 4. FIG. 4 corresponds to a cross section parallel to an YZ plane in FIG. 3.

As illustrated in FIGS. 4 to 6, the columnar portion CL is provided in a memory hole (opening) MH. The memory hole MH is provided in the memory cell array 1 of the stacked body 100. The memory hole MH extends along the stacking direction (Z direction) of the stacked body 100 in the stacked body 100. The columnar portion CL includes a memory film 30, a semiconductor body 20, and a core layer 50.

The memory film 30 is provided on an inner wall of the memory hole MH. A shape of the memory film 30 is, for example, cylindrical. The memory film 30 includes a block insulating film 31, a charge storage film 32, and a tunnel insulating film 33.

The block insulating film 31 is provided on the inner wall of the memory hole MH. The block insulating film 31 includes, for example, silicon oxide.

The charge storage film 32 is provided on the block insulating film 31. The charge storage film 32 includes, for example, silicon nitride. The charge storage film 32 has a trapping site for trapping charges in a film, and traps charges. A threshold voltage of the memory cell MC varies depending on a presence or absence of the trapped charges and an amount of trapped charges. Thus, the memory cell MC stores information.

The tunnel insulating film 33 is provided on the charge storage film 32. The tunnel insulating film 33 includes, for example, silicon oxide or silicon oxide and silicon nitride. The tunnel insulating film 33 is a potential barrier between the charge storage film 32 and the semiconductor body 20. The tunnel insulating film 33 tunnels the charges when injecting the charges from the semiconductor body 20 to the charge storage film 32 (writing operation) and discharging the charges from the charge storage film 32 to the semiconductor body 20 (erasing operation).

In the stacked body 100, the electrode layers (SGD, WL, and SGS) are provided on the memory film 30. The electrode layers (SGD, WL, and SGS) include, for example, tungsten.

The semiconductor body 20 is provided on the memory film 30 on a side opposite to the electrode layers (SGD, WL, and SGS). The semiconductor body 20 includes, for example, silicon. The silicon is, for example, polysilicon obtained by crystallizing amorphous silicon. A conductivity type of the silicon is, for example, P type. A shape of the semiconductor body 20 is, for example, a tubular shape having a bottom. The semiconductor body 20 is, for example, electrically connected to the substrate 10.

The core layer 50 is provided on the semiconductor body 20. The core layer 50 is insulating. The core layer 50 includes, for example, silicon oxide. A shape of the core layer 50 is, for example, a columnar shape. A cap layer 51 is provided on an upper surface of the core layer 50. The cap layer 51 includes, for example, silicon. The silicon is, for example, polysilicon obtained by crystallizing amorphous silicon. A conductivity type of the silicon is, for example, N type. The cap layer 51 is electrically connected to the semiconductor body 20 in an upper portion of the memory hole MH.

The memory hole MH is filled with the memory film 30, the semiconductor body 20, the core layer 50, and the cap layer 51.

A first insulating film 81 and a second insulating film 82 are provided on an upper surface of the stacked body 100. The first insulating film 81 is provided on the stacked body 100. The second insulating film 82 is provided on the first insulating film 81. In the second insulating film 82, a contact portion Cb is provided. For example, the contact portion Cb is electrically connected to the semiconductor body 20 and the cap layer 51.

As described above, in the memory cell array 1 of the semiconductor memory device according to the embodiment, a plurality of memory holes MH are formed in the same word line WL, and the memory cell MC is formed. The memory cell MC is stacked with the columnar CL extending in the Z direction in common, thereby forming the memory string MS. The plurality of memory strings MS that share the stacked word lines WL are formed in a matrix pattern on the substrate 10.

Basic Operation of First Embodiment

Next, the basic operation of the semiconductor memory device of the first embodiment will be described. The writing operation is performed in a unit of the word line (page). In one page, for example, a memory cell MC (writing selection) that shifts the threshold voltage and a memory cell MC (writing inhibition) that does not shift the threshold voltage coexist.

Writing Selection

The writing-selected memory cell MC shifts a threshold voltage thereof, for example, from data "1 (for example, erasing state)" to data "0". In this case, for example, the voltage of the bit line BL is set to the compensation voltage Vcmp in the group B0 and the ground potential GND in the group B1. In the writing-selected memory cell MC, charges (electrons) are injected into the charge storage film 32, and the threshold voltage is shifted in a positive direction. Therefore, for example, data "0" is written in the writing-selected memory cell MC.

Writing Inhibition

The writing-inhibited memory cell MC maintains the threshold voltage thereof as, for example, data "1 (for example, erasing state)". In this case, the voltage of the bit line BL in both of the groups B0 and B1 is, for example, the power supply voltage Vcc. In the writing-inhibited memory cell MC, the charges (electrons) are not injected into the charge storage film 32. Therefore, the threshold voltage maintains an original state. Thus, the writing-inhibited memory cell MC maintains, for example, data "1".

In the writing-selected memory cell MC, it may be desirable to avoid charges (electrons) being excessively injected into the charge storage film 32. When the charges are excessively injected into the charge storage film 32, the threshold voltage of the memory cell is shifted to a higher direction. Since a voltage waveform applied to the gate electrode is different in the same word line WL, a shift amount of the threshold voltage may be different depending on a distance from the row control circuit 202, that is, a resistance value of the word line WL.

When the selected word line WL is the group G0, the row driver 211 outputs the program voltage Vpgm0.

In the groups B0 and G0, a voltage V00 applied between the gate electrode and the semiconductor body of the writing-selected memory cell MC is "Vpgm0-Vcmp". A voltage applied between the gate electrode and the semiconductor body of the writing-inhibited memory cell MC is "Vpgm0-Vboost".

In the groups B1 and G0, a voltage V10 applied between the gate electrode and the semiconductor body of the writing-selected memory cell MC is "Vpgm0-GND". The voltage applied between the gate electrode and the semiconductor body of the writing-inhibited memory cell MC is "Vpgm0-Vboost".

When the selected word line WL is the group G1, the row driver 211 outputs the program voltage Vpgm1.

In the groups B0 and G1, a voltage V01 applied between the gate electrode and the semiconductor body of the writing-selected memory cell MC is "Vpgm1-Vcmp". The voltage applied between the gate electrode and the semiconductor body of the writing-inhibited memory cell MC is "Vpgm1-Vboost".

In the groups B1 and G1, a voltage V11 applied between the gate electrode and the semiconductor body of the writing-selected memory cell MC is "Vpgm1-GND". The voltage applied between the gate electrode and the semiconductor body of the writing-inhibited memory cell MC is "Vpgm1-Vboost".

From the above, it is possible to set V00<V10 and V01<V11. It is also possible to set V10=V01 or V10<V01 by selecting Vpgm0 and Vpgm1 to appropriate values. A relationship between these voltages may be appropriately set depending on a structure, a size, and the like of the memory cell array 1.

The voltages V00 to V11 applied between the gate electrode of the memory cell MC and the semiconductor body 20 forming the channel absorb a difference of the applied voltage waveform based on the distance from the row control circuit 202 and the shift amount of the threshold voltage for each selected memory cell can be set to the same degree.

When the compensation voltage Vcmp is set for each word line WL in the same memory string MS, the following operation is performed.

For example, the memory cells MC (i−1, 0) to the memory cells MC (i−1, n−1) of the memory string MS (i−1) are sequentially selected and data is written.

For example, the memory cell MC (i−1, j−1) is selected and data is written. In this case, the compensation voltage generation circuit 220b of the column driver 220 is set so as to output the compensation voltage Vcmp that is set in advance for the memory cell MC (i−1, j−1).

After writing of the memory cell MC (i−1, j−1) is completed, a next memory cell MC (i−1, j) is selected and data is written. In this case, the compensation voltage generation circuit 220b of the column driver 220 is set so as to output the compensation voltage Vcmp that is set in advance for the memory cell MC(i−1, j).

In this manner, the compensation voltage Vcmp that is set in advance is supplied to the bit line for each memory cell MC connected to different word lines.

Neighboring Word Line Interference

Figure 7:
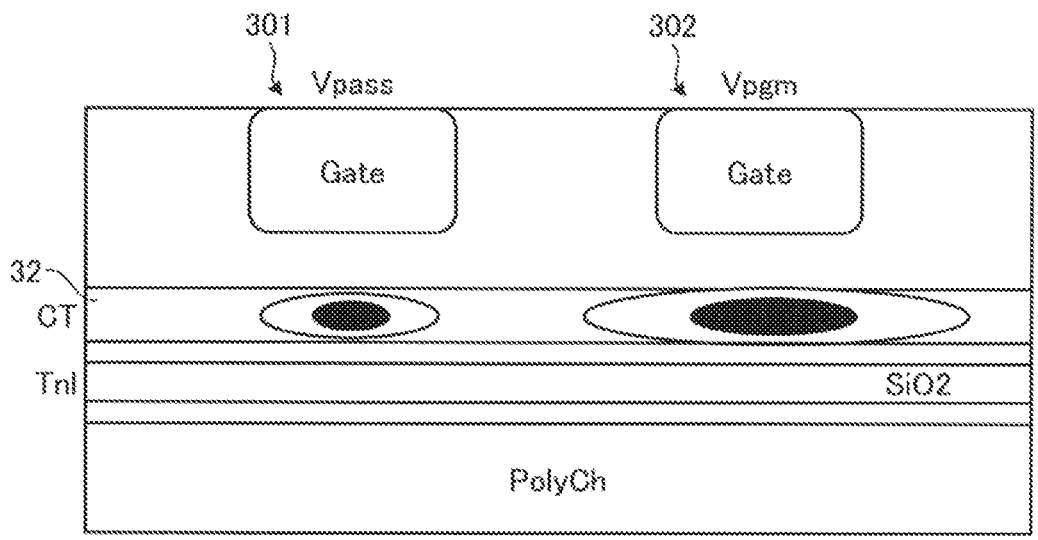
FIG. 7 is a diagram for describing neighboring word line interference.

Next, at the wiring of data, neighboring word line interference (NWI) generated between memory cells of adjacent word lines will be described. FIG. 7 is a diagram for describing the neighboring word line interference. In FIG. 7, a film denoted by a reference numeral "CT" is the above-described charge storage film 32 (charge trap film).

For example, when data is written to a first memory cell 301 and then data is written to an adjacent second memory cell 302, as illustrated in FIG. 7, the pass voltage Vpass is applied to the first memory cell 301 and the program voltage Vpgm is applied to the second memory cell 302. As a voltage of the second memory cell 302 that performs writing rises, a charge distribution accumulated in the charge storage film 32 of the second memory cell 302 spreads laterally as illustrated in FIG. 7, and the charge of the second memory cell interferes with the charge of the written first memory cell 301 (neighboring word line interference). When such neighboring word line interference occurs, a dynamic that may be disadvantageous in some implementations may occur: a threshold voltage of the first memory cell 301 fluctuates in an increasing direction.

Figure 8:
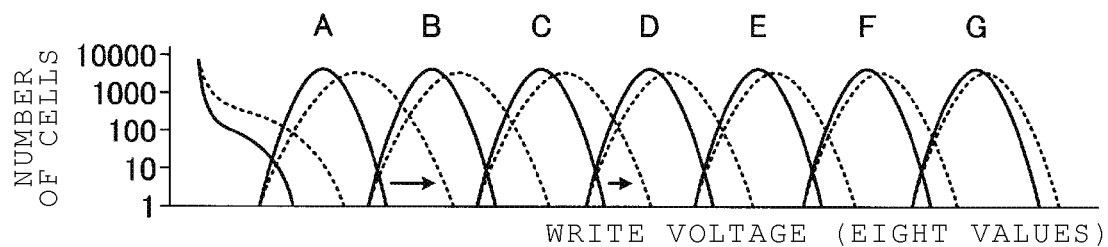
FIG. 8 is a diagram for describing fluctuation in a threshold voltage due to the neighboring word line interference.

Such fluctuations of the threshold voltage will be described in detail. In FIG. 8, a horizontal axis is the threshold voltage and a vertical axis is the number of cells. The threshold voltage illustrated by a solid line in FIG. 8 indicates eight threshold voltages (ER, A, B, C, D, E, F, and G) written in the memory cell 301 of a first word line. In addition, the threshold voltage illustrated by a dotted line in FIG. 8 indicates the threshold voltage of the memory cell 301 of the first word line at the time of writing the memory cell 302 of a second word line. By writing of the memory cell 302 of the adjacent second word line after writing of the memory cell 301 of the first word line, the threshold voltage of the memory cell 301 of which the writing is ended fluctuates in an increasing direction as illustrated by an arrow in FIG. 8, due to the neighboring word line interference. The fluctuation of the threshold voltage conspicuously appears at a low voltage such as the threshold voltage A and the threshold voltage B. An influence of the neighboring word line interference conspicuously may appear at the time of writing at a low voltage such as the threshold voltage A and the threshold voltage B.

A possibility of occurrence of the neighboring word line interference (NWI) which causes such fluctuation of the threshold voltage becomes higher as a pitch between memory cells becomes narrower. In addition, a possibility of occurrence of the neighboring word line interference (NWI) increases as the threshold voltage of the memory cell performing writing increases. It is possible to reduce or prevent charge interference to some extent by performing writing with respect to the memory cell 302 in a state in which the pass voltage Vpass applied to the memory cell 301 is lowered. However, such a state may have disadvantages in some implementations, and may have poor data storage characteristics for the memory cell 301.

Writing Control of Embodiment

From the above, at the time of writing, when the row control circuit 202 writes the threshold voltage A and the threshold voltage B having the low voltage value, the semiconductor memory device of the first embodiment sets the pass voltage Vpass of an adjacent memory cell to a second pass voltage value higher (a high pass voltage) than a first pass voltage value (a low pass voltage). The threshold voltage is an example of data. In addition, at the time of writing, when writing the threshold voltage C to the threshold voltage G of which the voltage value is medium or high, the row control circuit 202 returns the pass voltage Vpass of the adjacent memory cell to the first pass voltage value (a low pass voltage). The threshold voltage A and the threshold voltage B are examples of data less than a predetermined voltage value. The threshold voltage C to the threshold voltage G are examples of data equal to or greater than the predetermined voltage.

Figure 9:
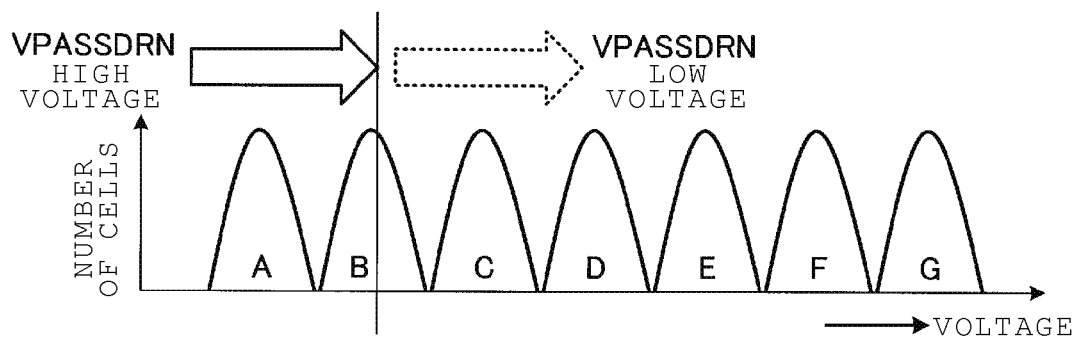
FIG. 9 is a diagram schematically illustrating a pass voltage control at a time of writing.

FIG. 9 is a diagram schematically illustrating the pass voltage Vpass control during such writing. As illustrated in FIG. 9, the row control circuit 202 increases the pass voltage Vpass of the memory cell adjacent to the memory cell on which writing is performed, when writing the threshold voltage A and the threshold voltage B having the low voltage values.

Figure 10:
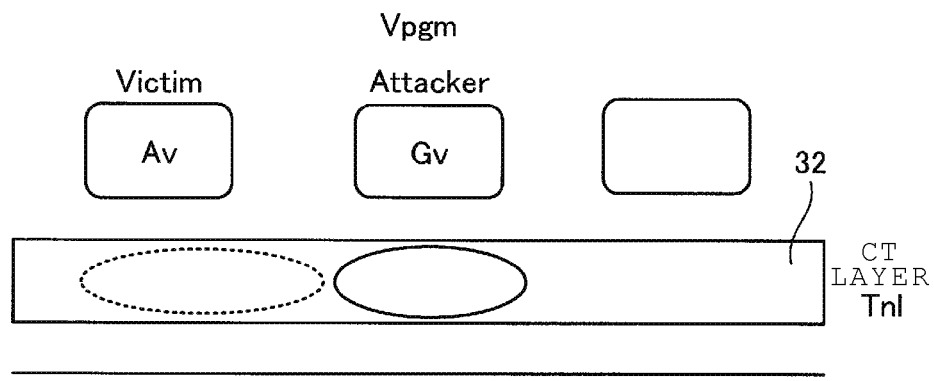
FIG. 10 is a diagram for describing a shield effect by charges between adjacent memory cells.

FIG. 10 is a diagram for describing a shield effect by charges between adjacent memory cells. In FIG. 10, a memory cell of "Victim" is a memory cell to which data is first written. A memory cell of "Attacker" is a memory cell to which the program voltage Vpgm of the threshold voltage A or the threshold voltage B is secondly or currently written. FIG. 10 indicates that at the time of writing the program voltage Vpgm of the threshold voltage A or the threshold voltage B, in a case where a high pass voltage Vpass is applied to the memory cell of "Victim", as illustrated by a dotted ellipse, in the charge storage film 32, a charge distribution of the pass voltage Vpass laterally expands. In addition, spread of the charge of the threshold voltage A or the threshold voltage B illustrated by a solid ellipse is prevented or reduced by the shield effect.

That is, since the program voltage Vpgm of the threshold voltage A or the threshold voltage B illustrated by the solid ellipse in FIG. 10 is a low voltage, charge spread in the charge storage film 32 is small. On the other hand, in a case where the pass voltage Vpass of the adjacent memory cell is increased, as illustrated by the dotted ellipse in FIG. 10, the charge spread becomes large, and it is possible to prevent or reduce the neighboring word line interference in the memory cell of "Victim" and in the memory cell of "Attacker" due to the shield effect.

The row control circuit 202 returns the pass voltage Vpass of the memory cell adjacent to the memory cell on which writing is performed to the low pass voltage value at the time of writing the threshold voltage C to the threshold voltage G of which the voltage value is medium or high.

Figure 11:
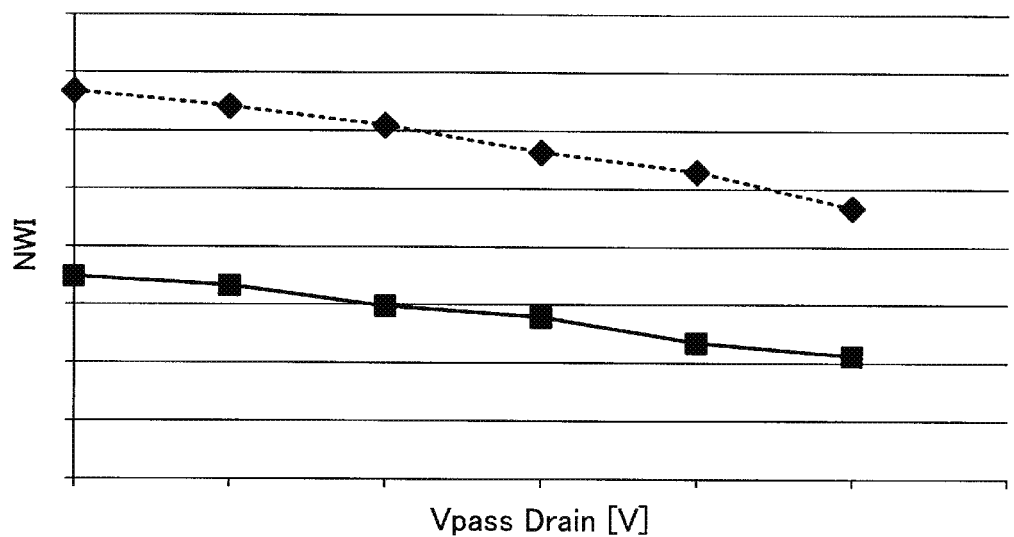
FIG. 11 is a characteristic diagram illustrating an occurrence rate of the neighboring word line interference.

FIG. 11 is a characteristic diagram illustrating an occurrence rate of the neighboring word line interference (NWI). In FIG. 11, a horizontal axis represents the pass voltage Vpass, a left side shows a voltage small, and a right side shows a voltage large. In addition, in FIG. 11, a vertical axis is the occurrence rate of the neighboring word line interference (NWI). In addition, a solid line graph is a graph in which a pitch between the memory cells is A nanometers (nm) and a dotted line graph is a graph in which the pitch between the memory cells is B nm (A>B: A and B are pitches selected according to design specifications). FIG. 11 indicates that in both cases where the pitch between the memory cells is wide (=pitch A: solid line graph) and the pitch between the memory cells is narrow (=pitch B: dotted line graph), the occurrence rate of the neighboring word line interference can be reduced or prevented by setting the pass voltage Vpass to a high voltage.

Effect of First Embodiment

As apparent from the above description, the row control circuit 202 of the semiconductor memory device of the first embodiment sets the pass voltage Vpass of the adjacent memory cell to a high voltage at the time of writing a low voltage such as the threshold voltage A and the threshold voltage B which may be significantly affected by the neighboring word line interference. In addition, at the time of writing the medium voltage or the high voltage such as the threshold voltage C to the threshold voltage G, the low pass voltage Vpass is returned. That is, the row control circuit 202 appropriately switches between the pass voltage Vpass of the high voltage for writing the threshold voltage of the low voltage and the pass voltage Vpass of the low pass voltage for writing the medium voltage and the high voltage (pass voltage Vpass of high voltage>pass voltage Vpass of low voltage).

Therefore, the charge distribution of the pass voltage Vpass of the high voltage applied to the memory cell adjacent to the memory cell to which the threshold voltage of the low voltage is written is increased, and it is possible to suppress the neighboring word line interference by the shield effect. Thus, it is possible to reduce or prevent fluctuation of the threshold voltage Vth written to the memory cell to which the pass voltage Vpass is applied and it is possible to improve data storage characteristic.

Second Embodiment

Figure 12:
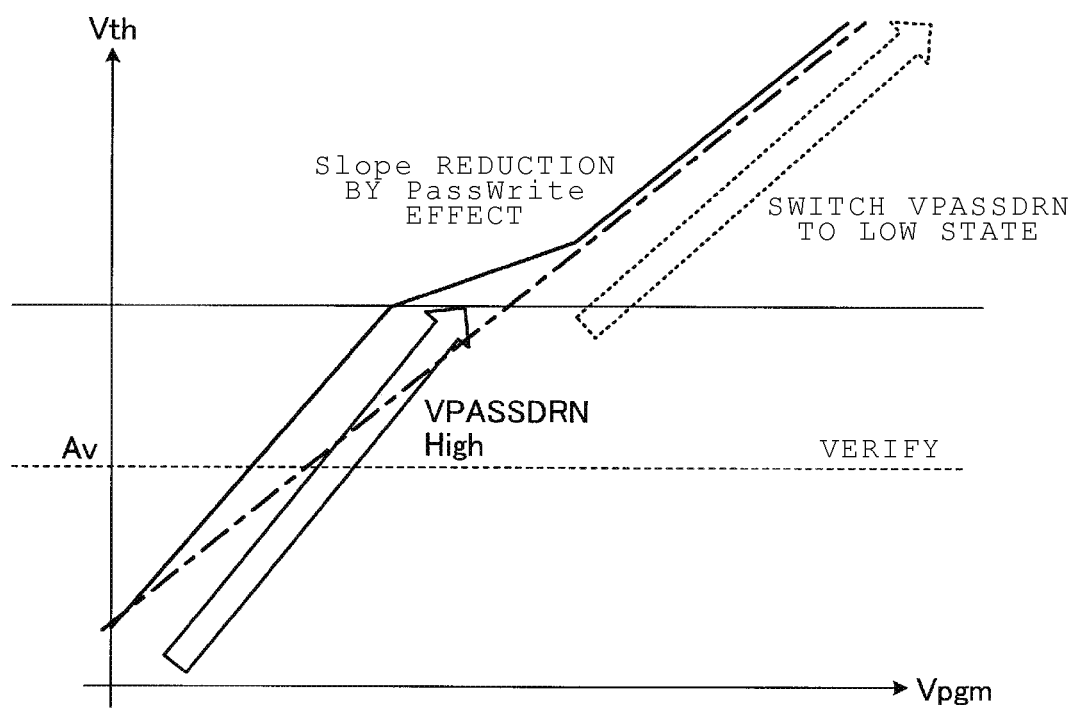
FIG. 12 is a diagram illustrating fluctuation of a slope of the threshold voltage by a pass voltage control.

Next, the semiconductor memory device of the second embodiment will be described. In FIG. 12, a horizontal axis represents the program voltage Vpgm, and a vertical axis represents the threshold voltage Vth of the multi-value written in one memory cell in written threshold voltage Vth. When step-up writing is performed, a voltage value of the program voltage Vpgm is gradually increased such as 0.5 V increments to perform writing the threshold voltage Vth of the multi-value. In addition, as illustrated by one dot chain line in FIG. 12, it may be advantageous that the threshold voltage Vth linearly transits from the threshold voltage Vth of the low voltage to the threshold voltage Vth of the high voltage and the writing is performed.

Figure 13:
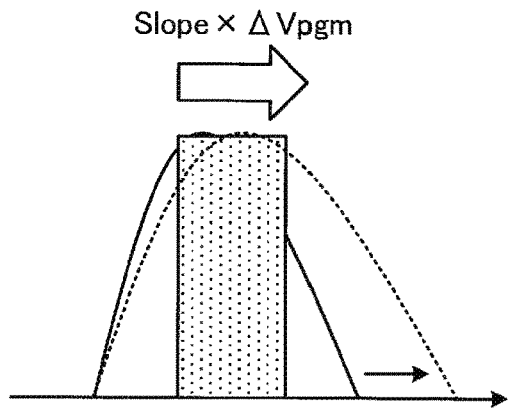
FIG. 13 is a diagram for describing an aspect in which a distribution of the threshold voltage spreads due to an increase of the slope of the threshold voltage or an increase of a value of the pass voltage.

However, as described in the first embodiment, at the time of the writing, when the pass voltage Vpass of the adjacent memory cell is increased, a writing efficiency of the memory cell performing writing is increased. When the writing efficiency is increased, a line indicating the transition of the threshold voltage Vth at the time of the writing becomes more likely to rise than the line of the dotted line indicating a targeted or desired (in some implementations) transition (a slope of the line becomes large) as illustrated by a solid line in FIG. 12. As the slope of the line indicating the transition of the threshold voltage Vth at the time of the writing becomes large, a distribution of the threshold voltage Vth widens as indicated by a dotted line in FIG. 13.

That is, a spread range of the distribution is calculated by calculation of "Slope×ΔVpgm", assuming that a magnitude of the slope of the line is "Slope" and a writing step voltage that is a step voltage width at the time of the writing is "ΔVpgm". Therefore, as the slope of the line (the value of the Slope) increases, the spread range of the distribution increases. In other words, a potential disadvantage in which writing of charges of a wide distribution is performed (e.g. before receiving the influence of the neighboring word line interference described above occurs).

It is conceivable to reduce the writing step voltage (the value of ΔVpgm). However, when the writing step voltage (the value of ΔVpgm) is set to be small, a disadvantage that a write time is long may occur.

In addition, when the pass voltage Vpass is switched from a high voltage to a low voltage at a timing indicated by a solid line in FIG. 12, the slope of the line (solid line) indicating the transition of the threshold voltage Vth gradually converges to that of the depicted dotted line due to a pass write effect.

Variable Control of Writing Step Voltage

In view of the above circumstances, in the second embodiment, at the time of the writing, the pass voltage Vpass of the adjacent memory cell is increased and the writing is performed while changing the writing step voltage (ΔVpgm).

Figure 14:
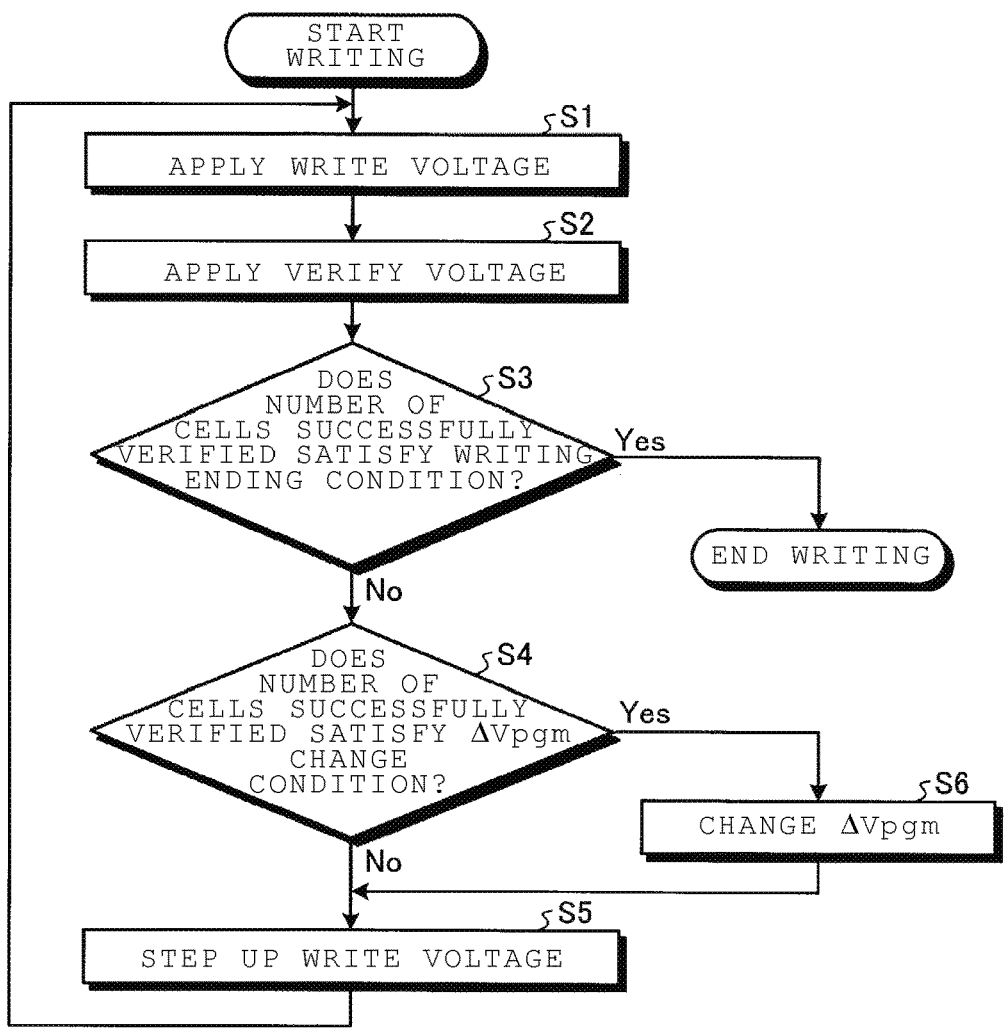
FIG. 14 is a flowchart illustrating a flow of a variable control of a writing step voltage.

FIG. 14 is a flowchart illustrating a flow of the variable control of such a writing step voltage (ΔVpgm). The flowchart of FIG. 14 is started when writing is started, and the row control circuit 202 executes a process from step S1. In step S1, the row control circuit 202 selects a desired word line and applies an initial writing step voltage (ΔVpgm). In addition, at the same time, the row control circuit 202 applies the pass voltage Vpass to the word lines (unselected word lines) other than the selected word line. At the time of writing the low threshold voltage such as the threshold voltage A and the threshold voltage B illustrated in FIG. 9, the row control circuit 202 controls the pass voltage Vpass to a high voltage. At the time of writing the high threshold voltage such as the threshold voltage C to the threshold voltage G, the row control circuit 202 controls by switching the pass voltage Vpass to the low voltage.

In step S2, the row control circuit 202 performs verification by applying a verify voltage to the memory cell on which the writing is performed. In addition, in step S3, the row control circuit 202 determines whether or not the number of cells of the memory cells successfully verified satisfies a writing end condition. When it is determined that the writing end condition is satisfied (step S3: Yes), the row control circuit 202 ends the process of the flowchart of FIG. 14 as it is. On the other hand, when it is determined that the writing end condition is not satisfied (step S3: No), the row control circuit 202 advances the process to step S4.

In step S4, the row control circuit 202 determines whether or not the number of cells of the memory cells successfully verified satisfies a change condition of the writing step voltage (ΔVpgm). In a case where it is determined that the change condition is not satisfied, the row control circuit 202 steps up the step voltage (ΔVpgm) by one step in step S5 and repeats the processes from step S1.

On the other hand, when it is determined that the change condition is satisfied, the row control circuit 202 changes the step voltage (ΔVpgm) in step S6. In addition, in a state of the changed step voltage (ΔVpgm), the process may return to step S1 through step S5, and the process is repeated from step S1 on the basis of the changed step voltage (ΔVpgm).

Figure 15:
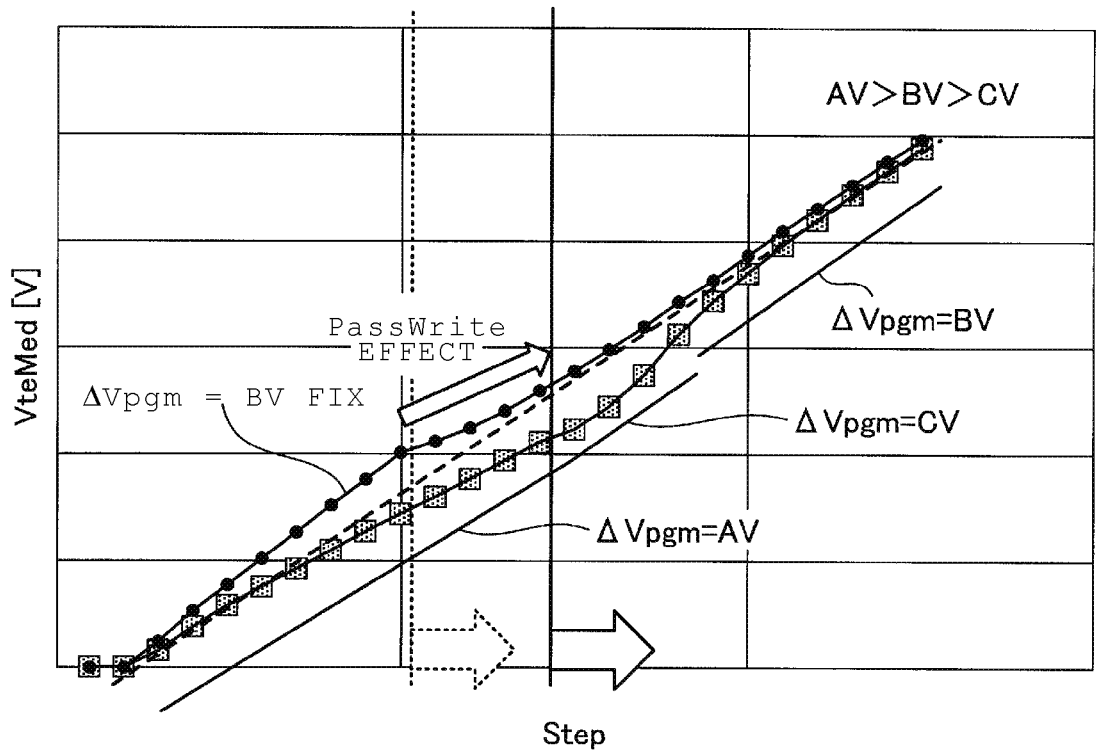
FIG. 15 is a diagram illustrating a transition of the written threshold voltage while variably controlling the writing step voltage.

A change control operation of such a step voltage (ΔVpgm) will be described using a specific example. FIG. 15 is a diagram illustrating the transition of the threshold voltage Vth written while variably controlling the writing step voltage (ΔVpgm). In FIG. 15, a horizontal axis represents an accumulation step number (integer value), and a vertical axis represents a magnitude (voltage value) of the written threshold voltage Vth. In addition, a dotted vertical line indicates a switching timing for switching from the pass voltage Vpass of the high voltage to the pass voltage Vpass of the low voltage in a graph in which black circle marks are connected. In addition, in a graph in which the black circle marks are connected, a solid vertical line indicates a timing until a change amount ΔVth of the threshold voltage becomes stable due to the pass write effect after the dotted vertical line.

In addition, in FIG. 15, a dotted line graph is a graph illustrating the transition of the voltage value of the threshold voltage Vth of a case where desired or targeted (in some implementations) writing is performed. The dotted line graph is an example of a straight line of the transition of the data voltage formed when data of multi-value (threshold voltage Vth) is desirably (in some implementations) written to the memory cell.

In addition, the graph in which black circle marks are connected is a graph illustrating the transition of the voltage value of the threshold voltage Vth of a case where the step voltage (ΔVpgm) is fixedly stepped up for every "B(V)" and the writing is performed. The graph in which the black circle marks are connected is an example of a transition line of the data voltage of data written to the memory cell by controlling the application of the first pass voltage and the second pass voltage.

Further, a graph in which square marks are connected is a graph illustrating the transition of the voltage value of the threshold voltage Vth of a case where the step-up is performed by the variably controlled step voltage (ΔVpgm) and the writing is performed.

In a case where the step voltage (ΔVpgm) is fixed to "B(V)", in the transition of the voltage value of the threshold voltage Vth, while the pass voltage Vpass that is set to a high voltage at the time of writing the threshold voltage Vth of the low voltage is applied, the threshold voltage Vth shows a larger slope than a slope of the desired dotted line graph, as illustrated in the graph in which the black circle marks are connected. In a case where the pass voltage Vpass is switched from the high voltage to the low voltage at a timing indicated by a dotted vertical line, the threshold voltage Vth gradually converges to a desired slope by the pass write effect.

That is, when the writing of the threshold voltage Vth is performed while stepping up the step voltage (ΔVpgm) by a fixed voltage of "B(V)", while applying the pass voltage Vpass of the high voltage value, the slope of the graph of the threshold voltage Vth becomes larger than the desired slope. In addition, although the pass voltage Vpass is returned from the high voltage value to the low voltage value, it takes some time for the slope of the graph of the threshold voltage Vth to return to the desired slope.

From such circumstances, in the second embodiment, in order to correct a portion where the slope is increased from the desired slope, the row control circuit 202 variably controls a voltage value corresponding to a step-up width of the step voltage (ΔVpgm) (e.g. a voltage value controlling the step-up width). Specifically, as illustrated in FIG. 15, during the application of the pass voltage Vpass of the high voltage value and until returning to a low slope by the pass write effect, the writing of the threshold voltage Vth is performed by the step voltage (ΔVpgm) of "A(V)" that is lower than the step voltage (ΔVpgm) of "B(V)" and is the step voltage (ΔVpgm) of the low voltage value (A(V)<B (V)). Therefore, the slope of the threshold voltage Vth increased by the pass voltage Vpass of the high voltage value can be made close to the desired slope.

Next, when the step voltage (ΔVpgm) is changed to a voltage (A(V)) lower than low as described above, after the slope of the threshold voltage Vth returns to the desired slope, there is a concern that the slope of the threshold voltage Vth becomes smaller than the desired slope. Therefore, at a timing when the slope of the threshold voltage Vth returns to the desired slope, the row control circuit 202 perform variably control so that the voltage value that becomes the step width of the step voltage (ΔVpgm) to "C(V)" that is higher than the low value. Therefore, it is possible to push the slope that tends to become smaller than the desired slope to the desired slope. It should be noted that magnitudes of the step voltage (ΔVpgm) of "A(V)", "B(V)", and "C(V)" are expressed as "A(V)<B(V)<C(V)". In some embodiments, the row control circuit 202 is configured to variably control a step-up width of a program voltage (e.g., the step voltage (ΔVpgm)) such that the step-up width of the program voltage is smaller in a first step than in a second step of the variable control. A voltage value may be set according to design specifications for these voltage values.

Next, the row control circuit 202 changes the voltage value of the step voltage (ΔVpgm) to "B(V)" that is the low voltage value at the timing when the slope of the threshold voltage Vth becomes the desired slope. Thus, the slope of the threshold voltage Vth can be maintained as desired.

Effect of Second Embodiment

As it is apparent from the above description, the semiconductor memory device of the second embodiment variably controls the step voltage (ΔVpgm) for writing the threshold voltage Vth in accordance with the switching control of the pass voltage Vpass of the adjacent memory cell at the time of the writing. Therefore, the slope of the written threshold voltage Vth can be made close to the desired slope, it is possible to write desired data, and it is possible to obtain the same or a similar effect as in the above-described first embodiment.

Third Embodiment

Next, the semiconductor memory device of the third embodiment will be described. The second embodiment described above is an example in which the slope of the threshold voltage Vth that changes by variably controlling the step voltage (ΔVpgm) to set the pass voltage Vpass to the high voltage. The third embodiment is an example in which a pulse width of the program voltage Vpgm for writing the threshold voltage Vth is changed. In other words, the third embodiment is an example in which an application time of the program voltage Vpgm is changed.

Figure 16A:
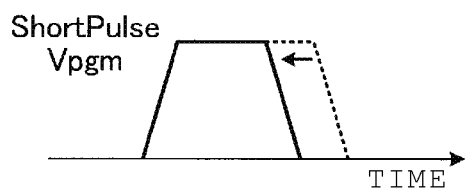
FIGS. 16A and 16B are diagrams illustrating a program voltage before and after changing a pulse width.
Figure 16B:
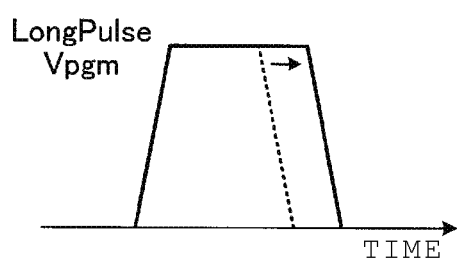

FIGS. 16A and 16B are diagrams illustrating the program voltage Vpgm before and after changing the pulse width. In FIGS. 16A and 16B, FIG. 16A illustrates a signal waveform of the program voltage Vpgm used for writing the threshold voltage A and the threshold voltage B of the low voltage value illustrated in FIG. 9. In addition, FIG. 16B illustrates the signal waveform of the program voltage Vpgm used for writing the threshold voltage C to the threshold voltage G of the high voltage value illustrated in FIG. 9.

Figure 17:
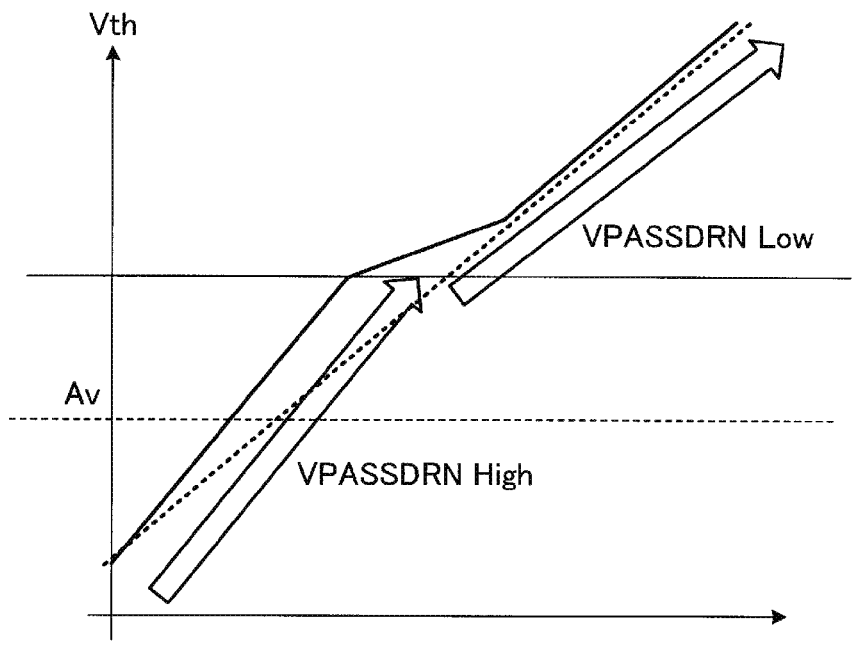
FIG. 17 is a diagram for describing fluctuation in the threshold voltage due to the neighboring word line interference.

As illustrated in FIG. 17 and as described above, by setting the pass voltage Vpass to the high voltage, with respect to the desired (in some implementations) slope of the threshold voltage Vth illustrated by the dotted line graph in FIG. 17, as illustrated by a solid line graph in FIG. 17, the slope of the threshold voltage Vth is increased. Therefore, while the pass voltage Vpass is set to the high voltage, the row control circuit 202 of the semiconductor memory device of the third embodiment performs the writing of the threshold voltage A and the threshold voltage B illustrated in FIG. 9 by the program voltage Vpgm of which the application time is shortened as the pulse width is narrowed as illustrated in FIG. 16A. In this regard, the waveform indicated by a dotted line in FIG. 16A corresponds to the program voltage Vpgm with a normal or reference pulse width, and the waveform indicated by a solid line corresponds to the program voltage Vpgm with a narrowed pulse width.

Figure 18:
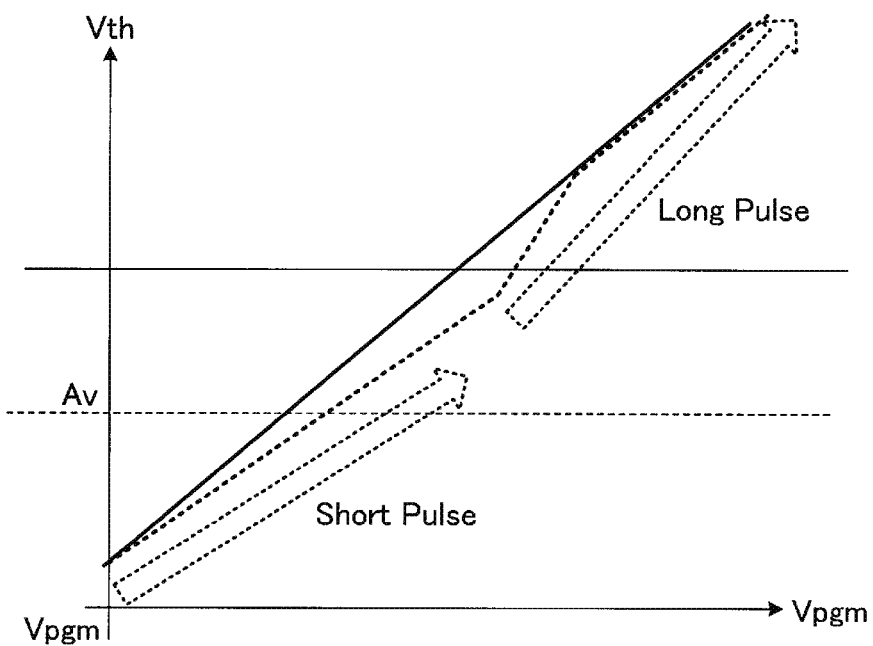
FIG. 18 is a diagram illustrating the slope of the threshold voltage obtained by changing the pulse width.

Therefore, since the application time of the program voltage Vpgm is shortened, it is possible to set the slope of the threshold voltage to be smaller than the desired slope indicated by a solid line as illustrated in FIG. 18. Thus, a large slope of the threshold voltage Vth while the pass voltage Vpass is set to the high voltage is canceled by a small slope of the threshold voltage Vth by the narrowing of the pulse width, and the slope of the threshold voltage Vth can be made close to the desired slope.

In addition, after switching the pass voltage Vpass from the high voltage to the low voltage, the row control circuit 202 performs the writing of the threshold voltage C to the threshold voltage G illustrated in FIG. 9 by the program voltage Vpgm of which the application time is longer as the pulse width is widened as illustrated in FIG. 16B. In this regard, the waveform indicated by a dotted line in FIG. 16B corresponds to the program voltage Vpgm with a normal or reference pulse width, and the waveform indicated by a solid line corresponds to the program voltage Vpgm with a widened pulse width.

Therefore, since the application time of the program voltage Vpgm becomes longer, the slope of the threshold voltage can be made closer to the desired slope indicated by the solid line as illustrated in FIG. 18. Thus, fluctuation caused by the pass write effect when the pass voltage Vpass is switched from the high voltage to the low voltage is suppressed and the slope of the threshold voltage Vth can be made close to the desired slope.

Figure 19:
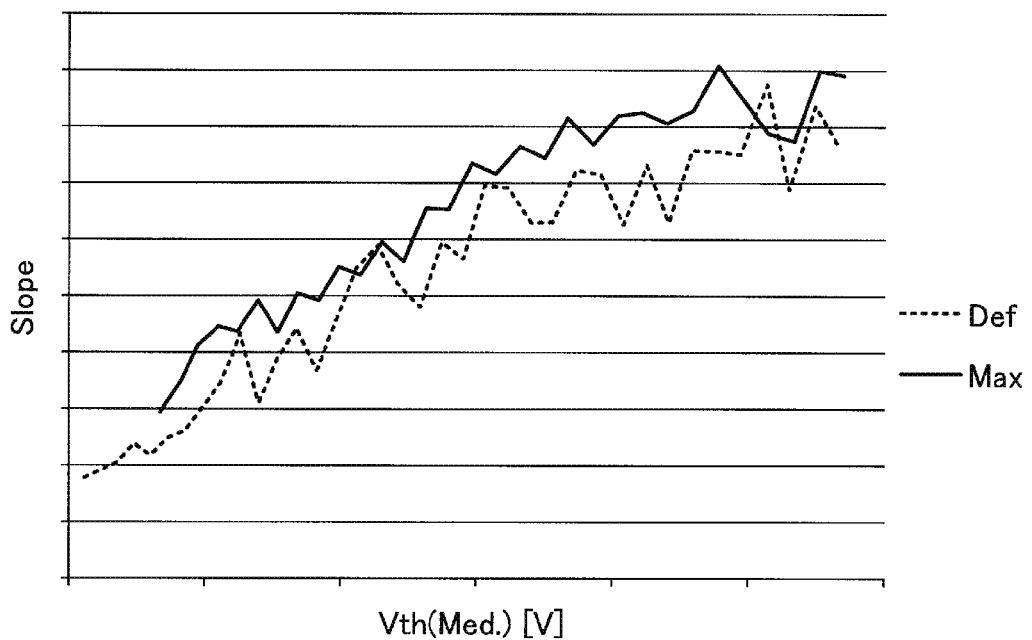
FIG. 19 is a diagram for describing that the slope of the threshold voltage is improved by changing the pulse width.

FIG. 19 is a diagram illustrating the slope of the threshold voltage Vth. In FIG. 19, a horizontal axis is the threshold voltage and a vertical axis is the slope of the threshold voltage (ΔVth/ΔVpgm). In addition, a dotted line graph (Def) shows a case where the program voltage Vpgm is applied with the pulse width at the time of a reference operation, and a solid line graph (Max) shows a case where the pulse width is becomes longer than in the reference operation. A comparison of the dotted line graph with the solid line graph shows that it is possible to increase the slope of the threshold voltage by increasing the pulse width of the program voltage Vpgm.

Figure 20:
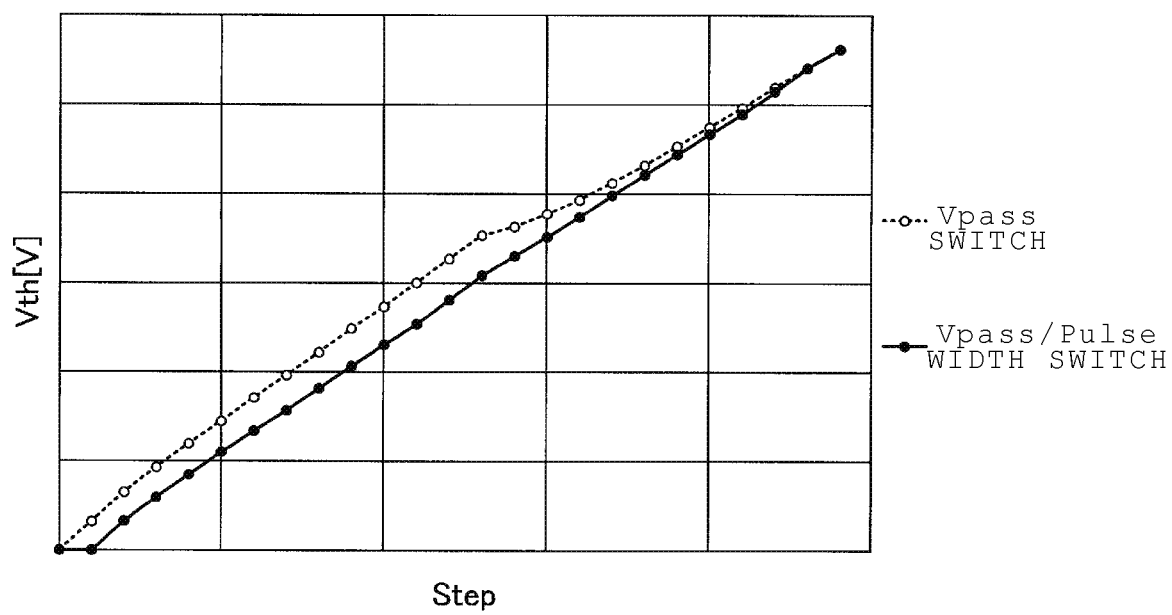
FIG. 20 is a diagram illustrating a magnitude of the slope of the threshold voltage of a case where the change control of the pulse width is performed together with switching of the pass voltage.

FIG. 20 is a graph illustrating the slope of the threshold voltage of a case where only the switching of the pass voltage Vpass is performed (a dotted line graph) and the slope of the threshold voltage of a case where the variable control of the pulse width is performed together with the switching of the pass voltage Vpass (a solid line graph). In FIG. 20, a horizontal axis is the step voltage (ΔVpgm) and a vertical axis is the voltage value of the threshold voltage Vth.

A comparison of the graph of the dotted line with the graph of the solid line in FIG. 20 shows that the slope of the threshold voltage can be made closer to the desired slope by changing the pulse width together with the switching of the pass voltage Vpass.

Figure 21:
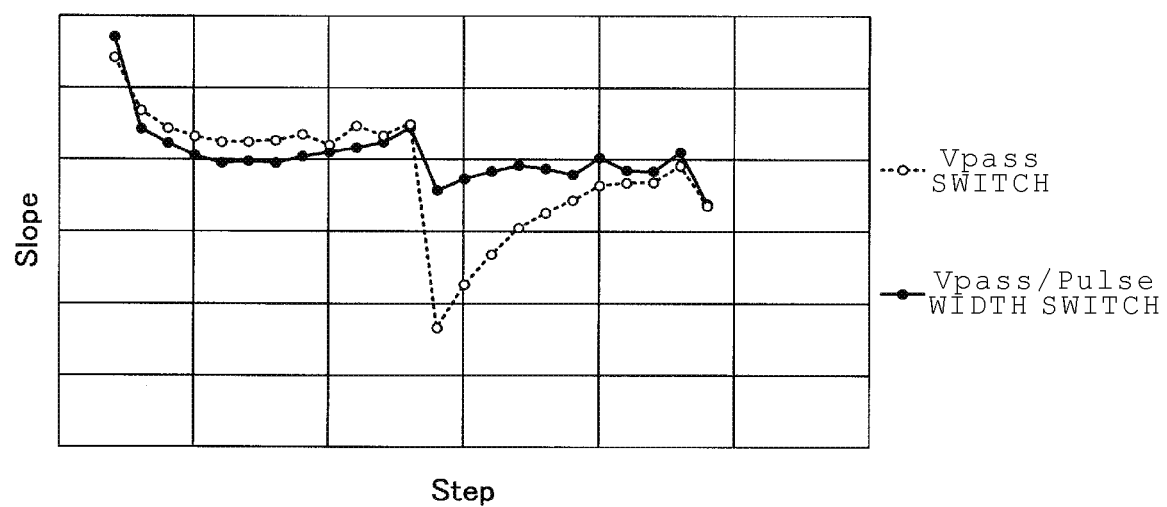
FIG. 21 is a characteristic diagram illustrating a relationship between slopes of the step voltage and the threshold voltage.

FIG. 21 is a characteristic diagram illustrating a relationship between the slopes of the step voltage and the threshold voltage (ΔVth/ΔVpgm). In FIG. 21, a horizontal axis is the slope of the step voltage and a vertical axis is the slope of the threshold voltage. In addition, in FIG. 21, a dotted line graph is a graph of a case where only the switching of the pass voltage Vpass is performed and a solid line graph is a graph of a case where the change control of the pulse width is performed together with the switching of the pass voltage Vpass.

A comparison of the dotted line graph with the solid line graph in FIG. 21 shows that fluctuation of the slope of the threshold voltage during the step-up writing can be reduced or prevented by performing the change control of the pulse width together with the switching of pass voltage Vpass, and the slope of the threshold voltage Vth can be made close to the desired slope.

Effect of Third Embodiment

As it is apparent from the above description, the semiconductor memory device of the third embodiment variably controls the pulse width of the program voltage Vpgm in accordance with the switching control of the pass voltage Vpass of the adjacent memory cell at the time of the writing. Therefore, the slope of the written threshold voltage Vth can be made close to the desired slope, it is possible to write desired data, and it is possible to obtain the same or a similar effect as the other above-described embodiments.

While embodiments of the present disclosure have been described, these embodiments are presented only by way of example and are not intended to limit the scope of the disclosure. These embodiments may be implemented in various other forms, and various omissions, substitutions, and changes may be made without departing from the gist of the disclosure. For example, although the present disclosure is applied to a so-called three-dimensional memory as illustrated in FIG. 3, the present disclosure is also applicable to a two-dimensional memory. Even in this case, the same or a similar effect as described above can be obtained. In addition, in the above described embodiments, the row control circuit 202 writes the data of a multi-value corresponding to the program voltage Vpgm to the memory cell, but the row control circuit 202 may write data of one value to the memory cell.

These embodiments and modifications thereof will fall within the scope and gist of the disclosure as well as within the disclosure described in the claims and the equivalent scope thereof.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "sub- stantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device comprising:
 a plurality of memory cells;
 a plurality of word lines connected to the plurality of memory cells, respectively; and
 a row control circuit configured to:
 apply a program voltage to a first word line among the word lines while stepping up a value of the program voltage;
 apply a first pass voltage to a second word line among the word lines different from the first word line when applying the program voltage having a voltage value equal to or greater than a predetermined voltage value to the first word line; and
 apply a second pass voltage having a voltage value higher than the first pass voltage to the second word line when applying the program voltage having a voltage value less than the predetermined voltage value to the first word line.

2. The semiconductor memory device according to claim 1,
 wherein the row control circuit is configured to variably control a voltage value corresponding to a step-up width of the program voltage according to an application control of the first pass voltage and the second pass voltage.

3. The semiconductor memory device according to claim 2, wherein the row control circuit is configured to control the step-up width of the program voltage such that a first step-up width of the program voltage in a first step of the variable control is smaller than a second step-up width of the program voltage in a second step of the variable control.

4. The semiconductor memory device according to claim 3, wherein the row control circuit is configured to control the step-up width of the program voltage such that a third step-up width of the program voltage in a third step of the variable control implemented after the first step and before the second step is larger than the second step-up width.

5. The semiconductor memory device according to claim 1,
 wherein the row control circuit is configured to variably control a pulse width of the program voltage according to an application control of the first pass voltage and the second pass voltage.

6. The semiconductor memory device according to claim 5,
 wherein the row control circuit is configured to narrow the pulse width of the program voltage by a predetermined time while the application control of the second pass voltage is performed and to widen the pulse width of the program voltage by a predetermined time while the application control of the first pass voltage is performed.

7. The semiconductor memory device according to claim 1, wherein the row control circuit is configured to write multi-value data to a memory cell among the memory cells that is connected to the selected first word line.

8. A data writing method for performing writing of data with respect to a semiconductor memory device including a plurality of memory cells and a plurality of word lines connected to the plurality of memory cells, respectively, the data writing method comprising:
selecting a first word line among the words lines;
applying a program voltage to the selected first word line while stepping up a value of the program voltage;
applying a first pass voltage to a second word line among the word lines different from the first word line, when applying the program voltage having a voltage value equal to or greater than a predetermined value to the first world line; and
applying a second pass voltage having a voltage value higher than the first pass voltage to the second word line when applying the program voltage having a voltage value less than the predetermined voltage value to the first word line.

9. The data writing method according to claim 8, further comprising:
variably controlling a voltage value corresponding to a step-up width of the program voltage according to an application control of the first pass voltage and the second pass voltage.

10. The data writing method according to claim 9, wherein variably controlling the voltage value corresponding to the step-up width of the program voltage is performed such that a first step-up width of the program voltage in a first step of the variable control is smaller than a second step-up width of the program voltage in a second step of the variable control.

11. The data writing method according to claim 10, wherein variably controlling the voltage value corresponding to the step-up width of the program voltage is performed such that a third step-up width of the program voltage in a third step of the variable control implemented after the first step and before the second step is larger than the second step-up width.

12. The data writing method according to claim 8, further comprising:
variably controlling a pulse width of the program voltage according to an application control of the first pass voltage and the second pass voltage.

13. The data writing method according to claim 12, wherein in variably controlling the pulse width, the pulse width of the program voltage is narrowed by a predetermined time while the application control of the second pass voltage is performed and the pulse width of the program voltage is widened by a predetermined time while the application control of the first pass voltage is performed.

14. The data writing method according to claim 8, further comprising writing multi-value data to a memory cell among the memory cells that is connected to the selected first word line.

* * * * *